United States Patent
Okabe et al.

(10) Patent No.: US 8,522,836 B2
(45) Date of Patent: Sep. 3, 2013

(54) SUBSTRATE STORAGE POD WITH REPLACEMENT FUNCTION OF CLEAN GAS

(75) Inventors: Tsutomu Okabe, Tokyo (JP); Toshihiko Miyajima, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 13/035,335

(22) Filed: Feb. 25, 2011

(65) Prior Publication Data
US 2011/0210041 A1 Sep. 1, 2011

(30) Foreign Application Priority Data
Feb. 26, 2010 (JP) ................................. 2010-041766

(51) Int. Cl.
*B65B 1/04* (2006.01)
(52) U.S. Cl.
USPC ............... 141/286; 141/63; 141/98; 206/710; 414/291; 414/935
(58) Field of Classification Search
USPC ............ 141/63, 66, 286, 349, 301–302, 197, 141/98; 414/935, 937, 217, 291; 206/710, 206/711
See application file for complete search history.

(56) References Cited

U.S. PATENT DOCUMENTS

| | | | |
|---|---|---|---|
| 6,368,411 B2 * | 4/2002 | Roberson et al. | 118/715 |
| 6,390,145 B1 | 5/2002 | Okabe et al. | |
| 6,641,349 B1 | 11/2003 | Miyajima et al. | |
| 7,077,173 B2 * | 7/2006 | Tokunaga | 141/66 |
| 7,658,289 B2 * | 2/2010 | Sumi et al. | 206/710 |
| 7,658,290 B2 * | 2/2010 | Sumi et al. | 206/710 |
| 8,043,659 B2 * | 10/2011 | Takahashi et al. | 427/248.1 |
| 8,146,623 B2 * | 4/2012 | Tieben et al. | 141/63 |
| 2004/0237244 A1 | 12/2004 | Suzuki et al. | |
| 2009/0092468 A1 * | 4/2009 | Oyama et al. | 414/222.01 |
| 2010/0059408 A1 | 3/2010 | Igarashi et al. | |
| 2010/0117377 A1 | 5/2010 | Okabe et al. | |
| 2010/0133270 A1 | 6/2010 | Okabe et al. | |
| 2011/0210042 A1 * | 9/2011 | Okabe et al. | 206/710 |

FOREIGN PATENT DOCUMENTS

| | | |
|---|---|---|
| EP | 1 075 023 A1 | 2/2001 |
| JP | 11-307623 | 11/1999 |
| JP | 2003-17553 | 1/2003 |
| JP | 2004-345715 | 12/2004 |
| JP | 2009-88437 | 4/2009 |

OTHER PUBLICATIONS

Japanese Office Action issued Jan. 5, 2012, in Patent Application No. 2010-041766 (with English-language translation).
U.S. Appl. No. 13/035,425, filed Feb. 25, 2011, Okabe, et al.

* cited by examiner

*Primary Examiner* — Timothy L Maust
*Assistant Examiner* — Timothy P Kelly
(74) *Attorney, Agent, or Firm* — Oblon, Spivak, McClelland, Maier & Neustadt, L.L.P.

(57) ABSTRACT

The substrate storage pod includes a pod case which includes a hollow inner space for storing a substrate, and an opening; a lid member which is capable of sealing the opening; an exhaust port for exhausting a replacement gas in the hollow inner space of the pod case; and an exhaust space which is defined in the hollow inner space so as to communicate to the exhaust port. The exhaust space is defined in the hollow inner space by a multi-hole partition member including multiple holes and by an inner surface of the pod case. In the substrate storage pod, back pressure on an exhaust side can be lowered, and hence dust in the pod can be collected to the exhaust side.

8 Claims, 7 Drawing Sheets

SUBSTRATE STORAGE POD WITH REPLACEMENT FUNCTION OF CLEAN GAS

BACKGROUND OF THE INVENTION

1. Field of the Invention

The present invention relates to a substrate container in which substrates such as semiconductor wafers are stored in an interior space and conveyed, and more particularly, to a front opening unified pod (FOUP) as a wafer storage pod as which performs opening and closing of a lid on a front side of the pod, and has a replacement function with respect to a clean gas in an interior space thereof.

2. Description of the Related Art

Processing operation on substrates such as semiconductor wafers (hereinafter, simply referred to as "substrates") includes multiple processing steps. Those processing steps are performed in a clean room which has a certain size and whose cleanliness is ensured. In the clean room, there are arranged processing apparatuses for performing respective processing steps. An interior space of each of the processing apparatuses has cleanliness maintained to be higher than that in the clean room in which the processing apparatuses themselves are arranged. The substrates are stored in a FOUP (hereinafter, referred to as "pod"), and conveyed together with the pod among the processing apparatuses for substrates such as semiconductor wafers, the processing apparatuses satisfying the front-opening interface mechanical standard (FIMS). During the substrates are moved from apparatus to apparatus, by keeping high cleanliness and preventing oxidization in the pod, it is unnecessary to control the environment of the entire of the wide clean room. As a result, it achieves efficient control and management to keep only ambient atmosphere around the substrates (minute volume relative to a volume of the clean room) in the high-cleanliness and oxidization-resistant states.

FIG. 5 illustrates a conventional type of pod 1 that is in a state in which the pod 1 is placed on the processing apparatus 20. Generally, the pod 1 includes a lid member 2 and a pod case (main container) 3. The pod case 3 has an opening 3a formed at one end thereof. The lid member 2 as a door of the pod 1 is capable of closing and sealing the pod case 3 by closing the opening 3a. The pod case 3 includes a shelf 5 arranged therein. The shelf 5 includes multiple stages arranged in pairs in parallel with each other in a vertical direction. Each pair of the multiple stages is generally arranged horizontally, and is capable of holding corresponding one of substrates.

An interior space 20a of the processing apparatus 20 is used in processing steps performed on the substrates. The interior space 20a of the processing apparatus 20 has cleanliness maintained to be higher than ambient atmosphere in a clean room. In the interior space 20a of the processing apparatus 20, there are arranged a transfer robot, a processing device, and the like. The processing apparatus 20 has a wall portion provided with an access opening 20b for access from an outside of the processing apparatus 20 into the interior space 20a of the processing apparatus 20. When a user does not access the interior space 20a of the processing apparatus 20 from the outside, as illustrated in FIG. 5, the access opening 20b is closed by a FIMS door 21 (hereinafter, referred to as "door"). The processing apparatus 20 includes a load port portion 22 for placing the pod 1 thereon. The load port portion 22 functions to place the pod 1 so that the pod 1 faces the access opening 20b. That is, first, when processing steps are performed on the substrates, the pod 1 is placed on the load port portion 22 of the processing apparatus 20. The pod 1 is properly placed On the load port portion 22 of the processing apparatus 20, so that the opening 3a of the pod case 3 of the pod 1 faces the access opening 20b of the processing apparatus 20. After that, the load port portion 22 performs positioning operation of arranging the pod 1 at a predetermined position. Simultaneously with opening and closing of the access opening 20b of the processing apparatus 20, the opening 3a of the pod case 3 of the pod 1 is opened. For example, generally, the door 21 holds the lid member 2 of the pod 1 so as to simultaneously open the access opening 20b of the processing apparatus 20 and the opening 3a of the pod case 3 of the pod 1. In this state, the substrates respectively placed on the pairs of the stages of the shelf 5 are moved in a horizontal direction so as to be taken out from the inside of the pod 1 through the opening 3a. Then, the substrates are transferred into the interior space 20a of the processing apparatus 20. Then, the substrates transferred into the interior space 20a of the processing apparatus 20 undergo the processing steps. After completion of the processing steps, the substrates are returned from the interior space 20a of the processing apparatus 20 into the pod 1 through the opening 3a. In this manner, the substrates are returned to predetermined pairs of stages of the shelf 5 in the pod case 3 in the pod 1.

When all the processing steps on the substrates in the pod 1 are completed, the door 21 of the processing apparatus 20 re-closes the access opening 20b of the processing apparatus 20. With this, the opening 3a of the pod case 3 is sealed by being closed by the lid member 2 of the pod 1, the lid member 2 being held by the door 21. In this stage, atmosphere in the pod case 3 is external atmosphere (ambient atmosphere in the interior space 20a) containing dust and oxygen. Thus, in order to maintain the substrates to be clean until the subsequent steps, it is necessary to remove the dust in the atmosphere and to remove gas components liable to react with surfaces of the substrates (in particular, oxygen ($O_2$)). Therefore, generally, after the lid member 2 closes and seals the pod case 3, the atmosphere in the pod 1 is replaced with an inert gas (hereinafter, referred to as "replacement gas").

As conventional means for replacing the atmosphere in the pod 1 with the replacement gas, there are various types. For example, Japanese Patent Application Laid-Open No. 2003-17553 and Japanese Patent Application Laid-Open No. 2004-345715 respectively disclose a pod of such a type that the air is supplied and exhausted through a bottom surface of the pod 1. In the pods of this type, as illustrated in FIG. 5, an air-supply port 23 and an exhaust port 24 are arranged in a lower portion of the pod case 3 of the pod 1. When predetermined pipes arranged on a processing-apparatus-20-side are connected to the air-supply port 23 and the exhaust port 24, as indicated by arrows of FIG. 5, the replacement gas is supplied into the pod 1 through the air-supply port 23 and exhausted from the pod 1 through the exhaust port 24.

In one of processing apparatuses, when the lid member 2 closes the pod case 3 after completion of processing steps on substrates, the atmosphere in the pod case 3 is ambient atmosphere in the interior space 20a containing dust and oxygen. Thus, in the pod 1, it is necessary to replace the atmosphere in the pod 1 with the replacement gas so that the dust is not blown up and is prevented from adhering to the substrates. Thus, when the atmosphere in the pod 1 is replaced with the replacement gas, the replacement-gas flow in the pod 1 is required to enter a stable laminar state free from flow disturbance. Further, it is desired that the gas in the pod 1 be completely replaced so that the dust in the pod 1 is discharged to the outside of the pod 1. Still further, it is desired that a state be achieved in which the dust in the pod 1 is constantly removed from the inside to the outside of the pod 1. However, the pod disclosed in each of Japanese Patent Application Laid-Open No. 2003-17553 and Japanese Patent Application Laid-Open No. 2004-345715 is not intended for solution of problems with discharge of the dust in the pod 1 to the outside of the pod 1.

In the pod disclosed in each of Japanese Patent Application Laid-Open No. 2003-17553 and Japanese Patent Application Laid-Open No. 2004-345715, the exhaust port 24 is not provided with a special configuration for removal of dust. Specifically, it is considered that, by setting of back pressure on an exhaust-port-24 side to be relatively lower than pressure on an air-supply-port-23 side, the replacement gas can be exhausted from the inside of the pod 1. However, actually, lowering of the back pressure on the exhaust-port-24 side does not necessarily directly lead to an effect of exhaust of the replacement gas from the inside of the pod 1. In order to exhaust the replacement gas from the inside of the pod 1, it is more effective to increase the pressure on the air-supply-port-23 side.

Note that, when static flow of the replacement gas to the exhaust-port-24 side is formed in the pod 1 by lowering of the back pressure on the exhaust-port-24 side, the dust in the pod 1 can be collected to the exhaust-port-24 side.

SUMMARY OF THE INVENTION

A purpose of the present invention is to effectively collect the dust contained in the atmosphere in the substrate storage pod to the exhaust port.

Another purpose of the present invention to provide a substrate storage pod, including a pod case which includes a hollow inner space for storing substrates, and an opening, a lid member which is capable of sealing the opening; an exhaust port for exhausting a replacement gas in the hollow inner space of the pod case, and an exhaust space which is defined in the hollow inner space so as to communicate to the exhaust port.

A further purpose of the present invention is to provide a substrate storage pod including a pod case which includes a hollow inner space for storing a substrate, and an opening, a lid member which is fit-inserted to the opening so as to be capable of sealing the opening, an exhaust port which is arranged in the pod case so as to exhaust a replacement gas in the hollow inner space, and an exhaust space which is defined in the hollow inner space by a multi-hole partition member including multiple holes and by an inner surface of the pod case and which fluidically communicates to the hollow inner space through the multiple holes of the multi-hole partition member, in which the exhaust port fluidically communicates to the hollow inner space only through the exhaust space so as to exhaust the replacement gas in the hollow inner space, and in which, in the exhaust space, an area of a region of the inner surface of the pod case is larger than a sectional area of a flow path of the exhaust port, the flow path corresponding to a point communicating to the exhaust space, the inner surface defining the exhaust space.

A still further purpose of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

Figure 1A:
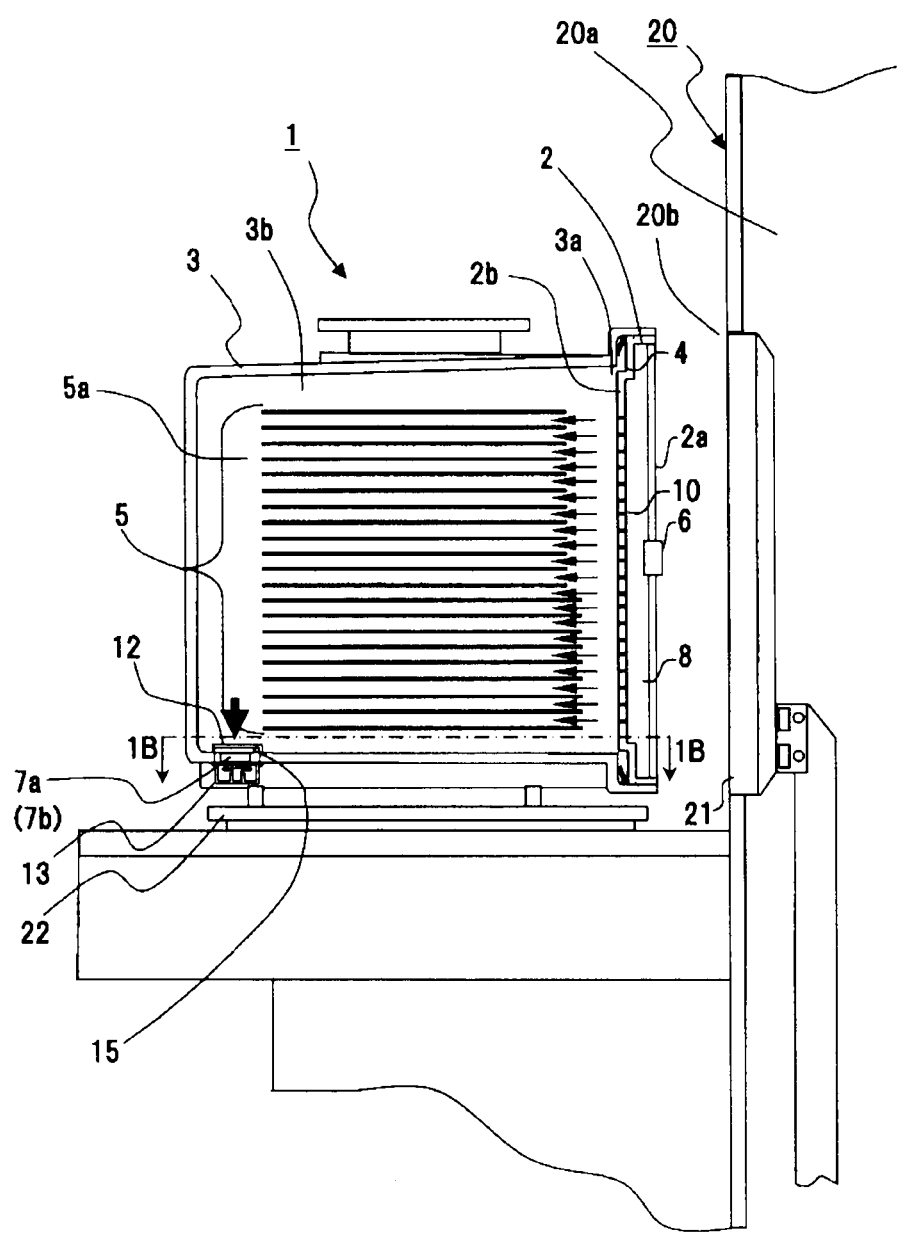
FIG. 1A is a sectional view of a structure of a pod of the present invention under a state in which the pod is placed on a processing apparatus, the structure being viewed in a horizontal direction, the view illustrating an example in which an air-supply portion is arranged in a lid member of the pod.
Figure 1B:
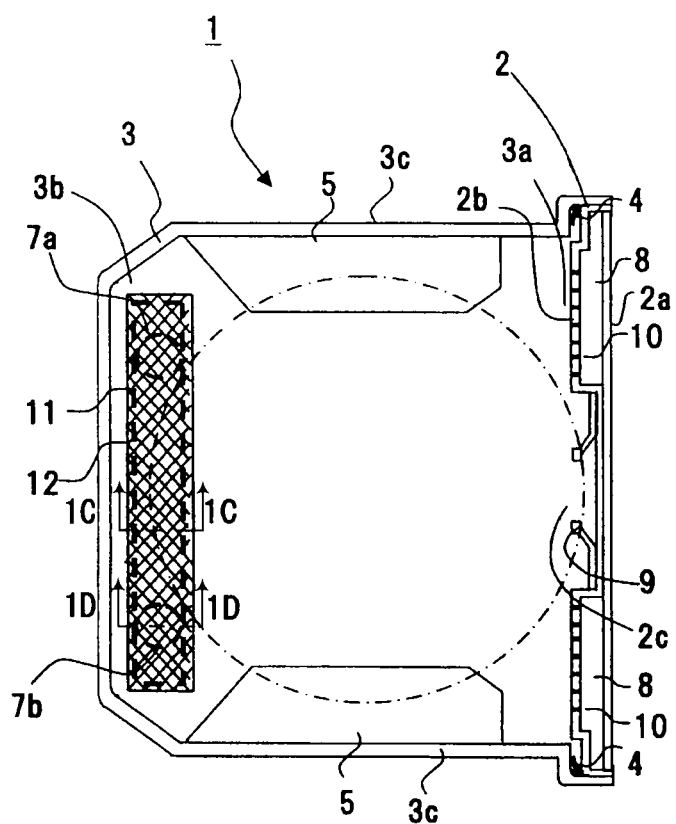
FIG. 1B is a sectional view taken along the line 1B-1B in FIG. 1A, illustrating an exhaust space of the pod illustrated in FIG. 1A and a lower-surface side in the pod 1 in a vertical direction.

In the following, a pod 1 of the present invention is explained with reference to FIGS. 1A to 1D and 2. FIG. 1A is a sectional view in which the pod 1 of the present invention is viewed in a horizontal direction, illustrating a state in which the pod 1 is placed on a processing apparatus 20. FIG. 1B is a sectional view taken along the line 1B-1B of FIG. 1A, illustrating a lower-surface side in the pod 1 in a vertical direction. Note that, the processing apparatus 20 is similar to the above-mentioned substrate-processing apparatus according to the related art. In the following, first, description is made only of the outline of the processing apparatus 20, and then, description is made in detail of how the pod of the present invention and the processing apparatus 20 used therefor are different from conventional ones.

The processing apparatus 20 includes an interior space 20a maintaining high cleanliness for the purpose of performing processing on the substrates in the processing apparatus 20. The processing apparatus 20 has a wall portion provided with an access opening 20b, the access opening 20b being normally closed by a door 21 when the processing is not performed. The processing apparatus 20 includes a load port portion 22 for installation of the pod 1 to a predetermined position so that the pod 1 appropriately faces the access opening 20b.

When processing steps are performed on substrates, the pod 1 is placed on the load port portion 22 of the processing apparatus 20. Then, the door 21 for closing the access opening 20b of the processing apparatus 20 opens the access opening 20b and the pod 1. Meanwhile, after all the processing steps on the substrates in the pod 1 are completed, the door 21 of the processing apparatus 20 re-closes the access opening 20b and the pod 1 so as to seal the pod 1. Then, atmosphere in the pod 1 is replaced with a replacement gas.

The pod 1 includes a lid member 2 and a pod case 3. The pod case 3 is provided with an opening 3a in one surface, and provided with a hollow inner space 3b for storing the substrates therein. The lid member 2 has a polygonal shape (typically, quadrangular shape) corresponding to a shape of the opening 3a of the pod case 3, and is a member for closing and sealing the opening 3a under a state in which the lid member 2 is completely fit-inserted to the opening 3a. In the specification of the present invention, a surface of the lid member 2 is defined as an inner surface (inside), the surface being on a side of facing an interior space of the pod 1 when the lid member 2 is completely fit-inserted to the opening 3a in a predetermined state. Meanwhile, another surface of the lid member 2 is defined as the outer surface (outside), another surface being on an opposite side to the inner surface.

The lid member 2 includes an inner plate 2b of the lid member 2 positioned on an inner-surface side of the lid member 2, an outer plate 2a positioned on an outer-surface side of the lid member 2, and side plates of the lid member 2. An inside of the lid member 2 is hollow. Buffer spaces 8 are defined in the hollow lid member 2. The buffer spaces 8 are hollow interior spaces defined by the inner plate 2b of the lid member 2, the outer plate 2a of the lid member 2, and the side plates of the lid member 2. Multiple holes 10 are arranged in the inner plate 2b of the lid member 2. Under the state in which the lid member 2 is fit-inserted to the opening 3a of the pod case 3 as predetermined, the holes 10 are provided by drilling of the inner plate 2b of the lid member 2 so as to establish communication between the inner plate 2b of the lid member 2 and each of the buffer spaces 8. Through the holes 10, the hollow inner space 3b of the pod case 3 and the buffer spaces 8 fluidically communicate to each other. The lid member 2 includes air-supply ports 6 fluidically communicating to the buffer spaces 8. The air-supply ports 6 are arranged, for example, in the outer plate 2a of the lid member 2, and are fluidically connectable to supply piping (not shown) connected to a replacement-gas source. The holes 10 function as an air-supply portion for sending out the replacement gas into the hollow inner space 3b of the pod case 3, the replacement gas having been supplied from the air-supply ports 6 into the buffer spaces 8.

Typically, the pod case 3 is substantially a hexahedron, and the opening 3a is arranged in one surface thereof. The pod case 3 has the hollow inner space 3b therein. A shelf 5 is arranged in the hollow inner space 3b, and is capable of storing substrates. As illustrated in FIG. 1B, the shelf 5 is, for example, adjacent to the opening 3a of the pod case 3, and is arranged so as to project from both sides, specifically, two vertical inner-wall surfaces 3c facing each other of the pod case 3 to a center of the hollow inner space 3b. The shelf 5 includes multiple stages 5a arranged in parallel with each other in the vertical direction in a normal state of the pod 1. The multiple stages 5a are horizontally arranged in pairs so as to correspond respectively to the side surfaces of the pod case 3, and each pair of the stages 5a is capable of holding both ends of corresponding one of the substrates (broken-line circular portion of FIG. 1B). The recessed portion 2c is provided on the inner-plate-2b side of the lid member 2. The recessed portion 2c has wafer retainers 9 that hold the substrates when the lid member 2 closes the opening 3a of the pod case 3. When the lid member 2 of the pod 1 is opened, the substrate placed on each pair of the stages 5a is released from corresponding one of the wafer retainers 9 of the lid member 2. Then, the substrates can be taken out or inserted through the opening 3a by being moved in the horizontal direction.

Figure 1C:
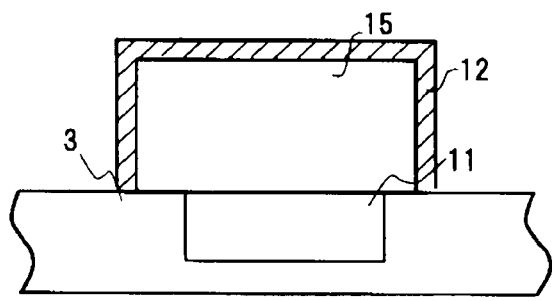
FIG. 1C is a sectional view taken along the line 1C-1C in FIG. 1B, illustrating the exhaust space of the pod illustrated in FIG. 1B.
Figure 1D:
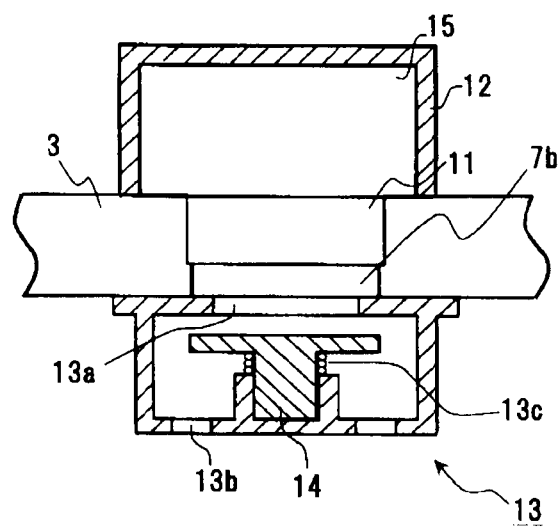
FIG. 1D is a sectional view taken along the line 1D-1D in FIG. 1B, illustrating the exhaust space of the pod illustrated in FIG. 1B and a state in which a valve member arranged with respect to the exhaust port opens.

In the pod case 3, a multi-hole partition member 12 is placed and fixed onto an inner surface of a lower portion on an inner-end side of the hollow inner space 3b of the pod case 3 (load-port-portion-22 side), the inner-end side corresponding to an opposite side of the opening 3a. The multi-hole partition member 12 is a frame unit having, for example, a rectangular parallelepiped shape; specifically, is a frame-like member formed of members such as mesh members, each of which includes multiple holes and is tightened over corresponding one of surfaces of the frame unit. It suffices that each of the multiple holes has a size large enough to allow dust to pass therethrough. For example, a mesh grid corresponds to the multiple holes. Inner surfaces of the multi-hole partition member 12 and the pod case 3 define an exhaust space 15. Specifically, at a point on which the multi-hole partition member 12 is placed, the exhaust space 15 is defined so as to have a bottom surface corresponding to the inner surface of the pod case 3 partitioned by the multi-hole partition member 12 and have other surfaces corresponding to the inner surfaces of the multi-hole partition member 12. The exhaust space 15 fluidically communicates to the hollow inner space 3b of the pod case 3 through the multiple holes of the multi-hole partition member 12. Further, it is preferred that the exhaust space 15 be arranged so as to extend in an elongated manner in a direction of forming an angle with respect to a gas flow from an air-supply portion into the exhaust space. In particular, it is preferred that the exhaust space 15 be arranged in a direction orthogonal to the gas flow from the air-supply portion into the exhaust space. For example, when the air-supply portion is arranged on an opening-3a side of the pod case 3 so that the exhaust space 15 is arranged in a lower portion on an inner-end side of the hollow inner space 3b of the pod case 3, it is preferred that the exhaust space 15 be defined in the hollow inner space 3b so as to extend in a width direction of the opening 3a of the pod case 3, the inner-end side corresponding to an opposite side of the opening 3a. The exhaust space 15 merely may be formed of the multi-hole partition member 12 fixed onto the inner surface of the pod case 3. Further, as illustrated in FIGS. 1A to 1D, an elongated pit (groove) 11 may be added which is formed by digging-down of a region of the inner surface of the pod case 3, the region defining the exhaust space 15. FIG. 1C illustrates a cross-section at the elongated pit 11 at a portion where an exhaust port 7a is not arranged, while FIG. 1D illustrates another cross-section of the elongated pit 11 at a portion where an exhaust port 7b is arranged. Note that, a shape of the multi-hole partition member 12 is not limited to a rectangular parallelepiped shape as long as a certain volume is secured. Instead, there may be employed a polygonal shape other than the rectangular parallelepiped shape or a curved-surface shape free from corner portions.

The exhaust ports 7a and 7b are arranged in a region of an outer surface of the pod case 3, the region corresponding to a position at which the exhaust space 15 is defined and being in the lower portion on the inner-end side of the pod case 3 (load-port-portion-22 side), the inner-end side corresponding to the opposite side of the opening portion of the pod case 3. The exhaust port 7a and the exhaust port 7b directly communicate only to the exhaust space 15, and fluidically communicate to the hollow inner space 3b only through the exhaust space 15. The exhaust port 7a and the exhaust port 7b fluidically communicate to the hollow inner space 3b only through the exhaust space 15 so as to exhaust an atmospheric gas in the hollow inner space 3b. The exhaust space 15 is set so that an area of the inner surface of the pod case 3 is larger than a total sum of sectional areas of flow paths of the exhaust port 7a and the exhaust port 7b, the flow paths corresponding to points communicating to the exhaust space 15, and the inner surface defining the exhaust space 15. Setting is made so that direct communication between the exhaust port 7a and the exhaust space 15 and the exhaust port 7b and the exhaust space 15 leads and fluid resistance of the gas to cause pressure in the exhaust space 15 to be lower than that in the hollow inner space 3b, the fluid resistance being exerted by the multi-hole partition member 12. In this manner, a state is achieved in which, in a static state, the dust in the atmospheric gas in the hollow inner space 3b is attracted into the exhaust space 15. Further, setting the pressure in the exhaust space 15 to be lower than that in the hollow inner space 3b causes the dust and oxygen contained in the atmospheric gas to once flow from an inside of the hollow inner space 3b into the exhaust space 15 through the multiple holes of the multi-hole partition member 12, the dust and the oxygen hardly return into the hollow inner space 3b through the multiple holes of the multi-hole partition member 12 in realty. Thus, the dust and the oxygen are retained in the exhaust space 15 by being reflected by the multi-hole partition member 12, and finally, are discharged from the exhaust port 7a and the exhaust port 7b to the outside of the pod 1.

Note that, like the above description in this embodiment in which the exhaust port 7a and the exhaust port 7b are provided, it is not necessary to provide two or more exhaust ports, and a single exhaust port may be provided instead. In this case, it suffices that the single exhaust port is arranged so that the area of a region of the inner surface of the pod case 3 is larger than a sectional area of a flow path of the single exhaust port, the flow path corresponding to the point communicating to the exhaust space 15, the region defining the exhaust space 15.

Figure 2:
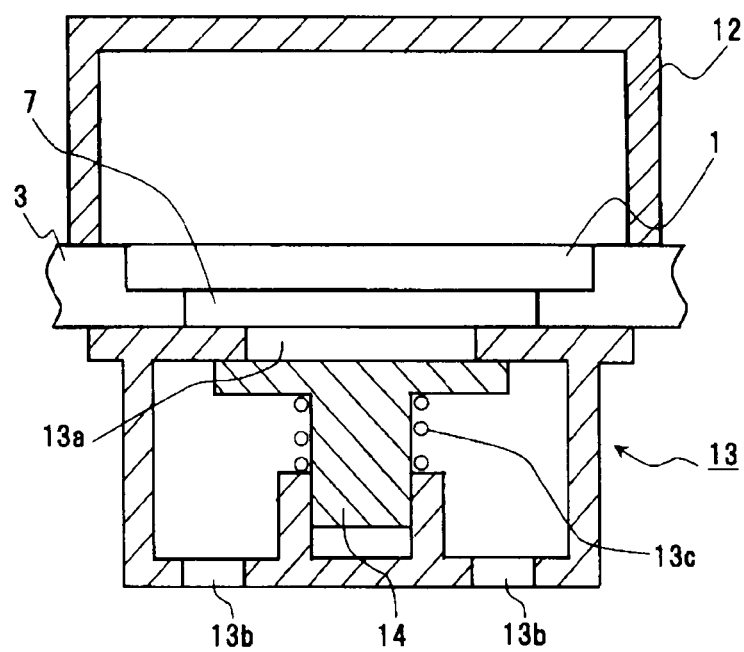
FIG. 2 is a sectional view taken along the line 1D-1D in FIG. 1B, illustrating the exhaust space of the pod illustrated in FIG. 1D and a state in which the valve member arranged with respect to the exhaust port closes.

A valve member 13 may be attached to each of the exhaust port 7a and the exhaust port 7b. FIG. 1D illustrates the valve member 13 in an open state, and FIG. 2 illustrates the valve member 13 in a close state. The valve member 13 includes an inlet 13a and outlets 13b. A piston portion 14 is arranged in the valve member 13, and the air-supply valve member 13 closes the inlet 13a in a normal state (FIG. 2). In this state, a spring 13c urges the piston portion 14 to the inlet 13a, and then a head of the piston portion 14 closes and seals the inlet 13a. When inner pressure of the pod 1 becomes high, pressure is applied to the head of the piston portion 14 so that gas in the pod 1 is introduced from the inlet 13a into the valve member 13. With this, the spring 13c is compressed, and then the head of the piston portion 14 having been urged by the spring 13c to the inlet 13a retracts from the inlet 13a so that the valve member 13 opens. The gas in the pod 1 flows as it is from the inlet 13a into the outlets 13b, and then is discharged from the outlets 13b (FIG. 1D), the gas having applied pressure to the head of the piston portion 14. In this manner, the gas in the pod 1 is discharged according to the inner pressure of the pod 1.

Figure 3A:
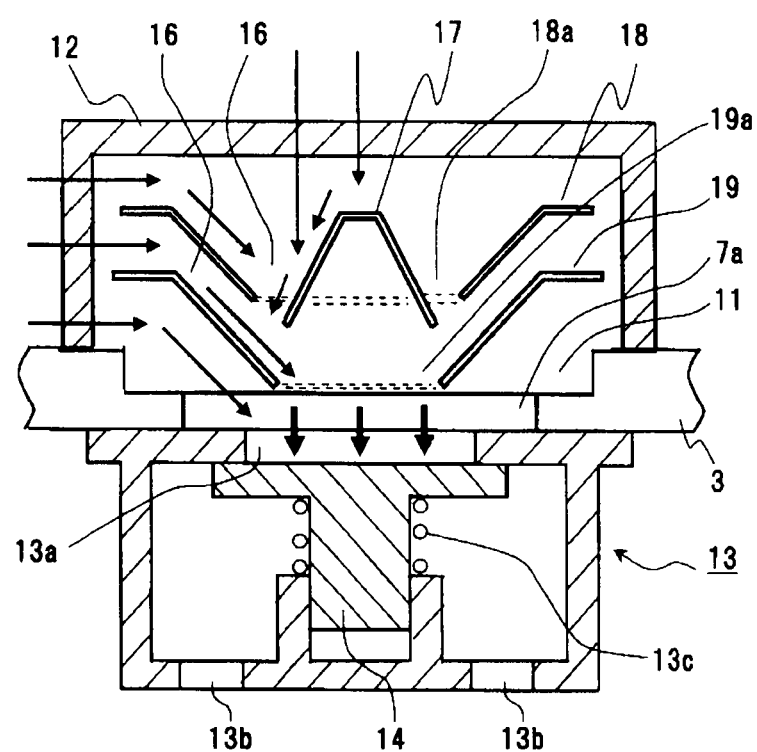
FIG. 3A is a sectional view of the exhaust space, illustrating an example in which meandering flow paths are formed in the exhaust space.
Figure 3B:
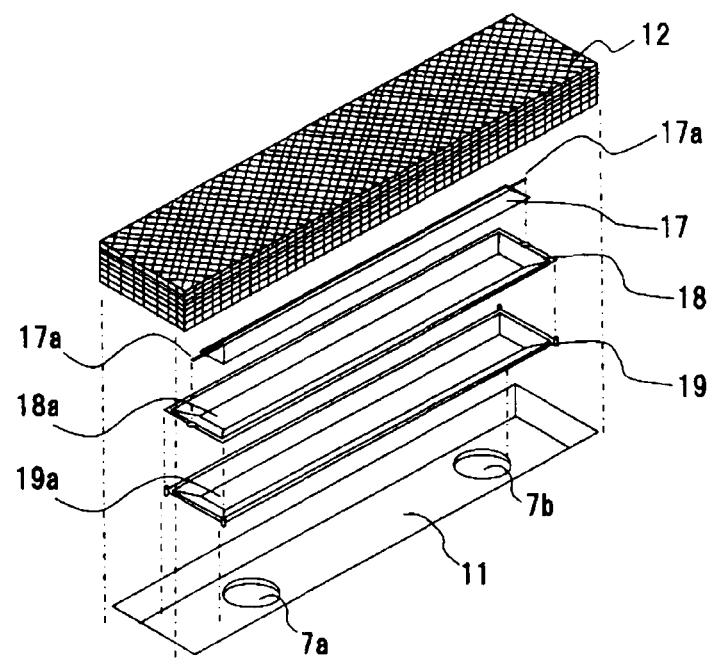
FIG. 3B is an exploded view illustrating the example in which the meandering flow paths are formed in the exhaust space.

Although the exhaust space 15 may be formed by a mere hollow space, meandering flow paths 16 may be arranged in the exhaust space 15. The meandering flow paths 16 make gas flowing from the hollow inner space 3b into the exhaust port 7 by way of the exhaust space 15 meander in the exhaust space 15. Description is made of the meandering flow paths 16 with reference to FIGS. 3A and 3B. FIG. 3A is a sectional view of the exhaust space 15 in a case where the meanderings flow path 16 are formed. FIG. 3B is an exploded view illustrating a combination of multiple partition plates including a partition plate 17, a partition plate 18, and a partition plate 19 which are used for formation of the meandering flow paths 16. Note that, although the meandering flow path can be formed merely by arrangement of one plate instead of the multiple partition plates, description herein is made of an example in which the meandering flow paths are formed between the multiple partition plates by combination of the multiple partition plates.

As illustrated in FIG. 3B, the meandering flow paths 16 are formed of the partition plate 17, the partition plate 18, and the partition plate 19 arranged in combination in the exhaust space 15 defined in the multi-hole partition member 12. The partition plate 17 has substantially a triangular shape in cross-section and includes a top portion arranged to an upper side of the exhaust space 15, that is, to the hollow inner space 3b of the pod case 3. The partition plate 18 and the partition plate 19 each have substantially a trapezoidal shape in cross-section and respectively include top-surface portions as a through-hole 18a and a through-hole 19a. The partition plate 18 and the partition plate 19 are arranged in the vertical direction with the through-hole 18a and the through-hole 19a being directed downward. In this case, for example, the partition plate 17 is fixed by a support bar 17a attached to the top portion thereof so that a gap is secured between the partition plate 17 and the partition plate 18. When positioning is effected on the partition plate 19 so that the partition plate 19 is partially inserted into the elongated pit 11, a height of the multi-hole partition member 12 defining a height of the exhaust space 15 can be suppressed. Further, in the multi-hole partition member 12, for example, the partition plate 18 is supported by support bars attached respectively to four corners of the partition plate 19 so that a gap is secured between the partition plate 18 and the partition plate 19. For example, by such combination, the partition plate 17, the partition plate 18, and the partition plate 19 can be formed integrally with each other in the exhaust space 15 with the gaps being secured therebetween.

As illustrated in FIG. 3A, when the partition plate 17, the partition plate 18, and the partition plate 19 can be arranged in the exhaust space 15 with the gaps being secured therebetween, those gaps form the meandering flow paths 16. In this context, specific description thereof is made by way of an example in which the multiple partition plates are combined with each other as follows: skirt portions of the partition plate 17 are inserted into the through-hole 18a of the partition plate 18 so that surfaces of the partition plate 17 are positioned on extension lines from surfaces of the partition plate 18; and the partition plate 19 is arranged lower than the partition plate 17 so that surfaces of the partition plate 19 are positioned on extension lines from surfaces of the partition plate 17. With such combination, as indicated by arrows of FIG. 3A, gas flows collide respectively against the partition plate 17, the partition plate 18, and the partition plate 19. As a result, the meandering flow paths 16 can be formed which achieve complicated gas flows proceeding, while colliding against other partition plates, to the exhaust port 7a and the exhaust port 7b. When the meandering flow paths 16 are complicated, the dust in the atmospheric gas having flown into the exhaust space 15 is more effectively prevented from returning into the hollow inner space 3b of the pod case 3.

In the pod 1 under a state in which the pod case 3 is sealed by the lid member 2 fit-inserted thereto, it is preferred that the holes 10 of the inner plate 2b of the lid member 2 be arranged between each pair of the stages 5a of the shelf 5 under a state in which the lid member 2 is fit-inserted to the opening 3a of the pod case 3. That is, it is preferred that the holes 10 have positional relations determined correspondingly to spaces between the stages 5a of the shelf 5, and be provided by drilling of the inner plate 2b of the lid member 2. With this, the replacement gas introduced from the holes 10 into the hollow inner space 3b of the pod case 3 flows from the opening 3a of the pod case 3 to the exhaust space 15 positioned on the inner-end side of the pod case 3 along the substrates respectively held on the pairs of the stages 5a. With this, flow free from disturbance can be achieved, and the dust in the atmospheric gas can be efficiently collected into the exhaust space 15.

Note that, in the above-mentioned example, the air-supply portion includes the multiple holes 10 arranged in the inner plate 2b of the lid member 2. However, it is not necessary to form the air-supply portion with the multiple holes in the inner plate 2b of the lid member 2, and a single hole may be formed in the inner plate 2b of the lid member 2 instead.

Figure 4:
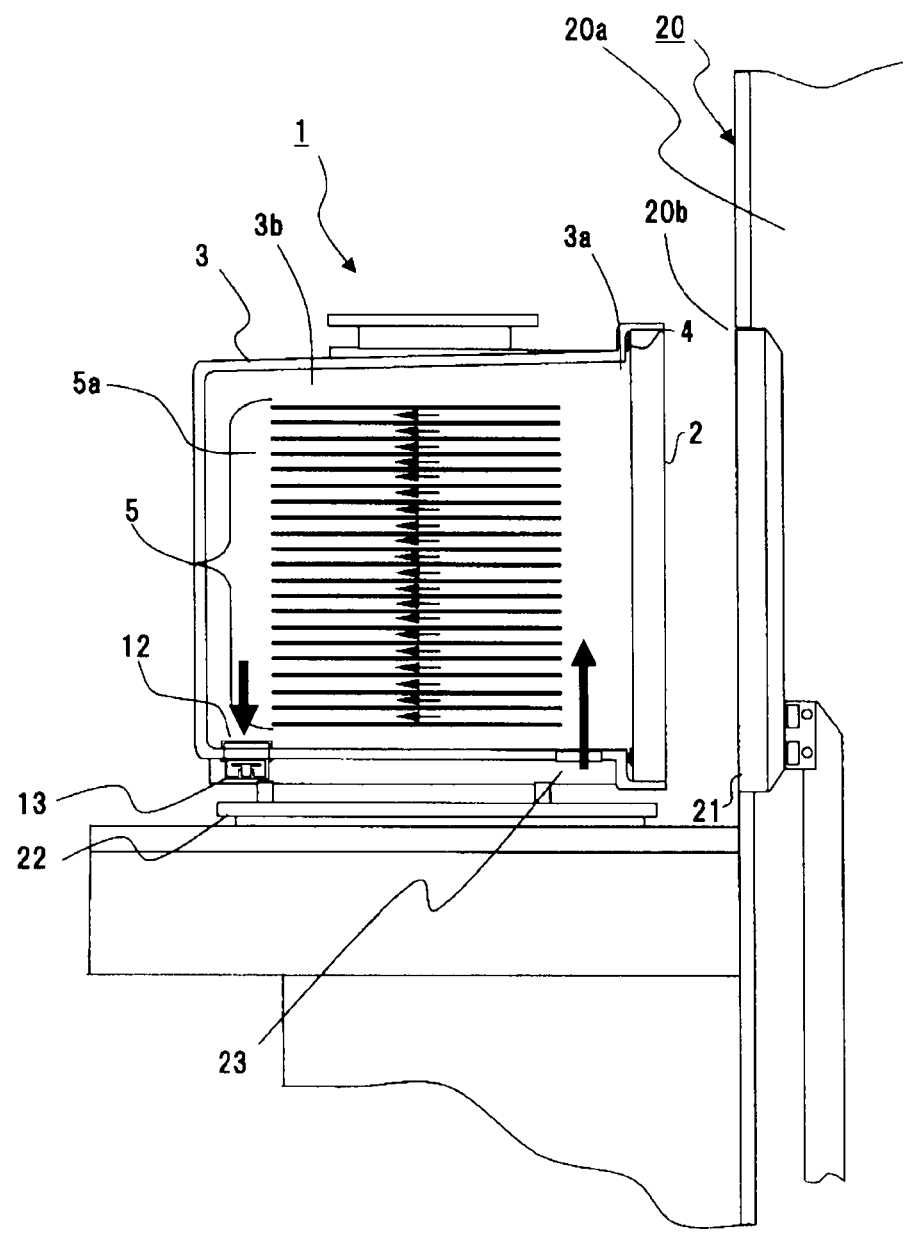
FIG. 4 is a sectional view of a structure of the pod of the present invention under a state in which the pod is placed on the processing apparatus, the structure being viewed in a horizontal direction, the view illustrating an example in which the air-supply portion is arranged in a lower portion of the pod.
Figure 5:
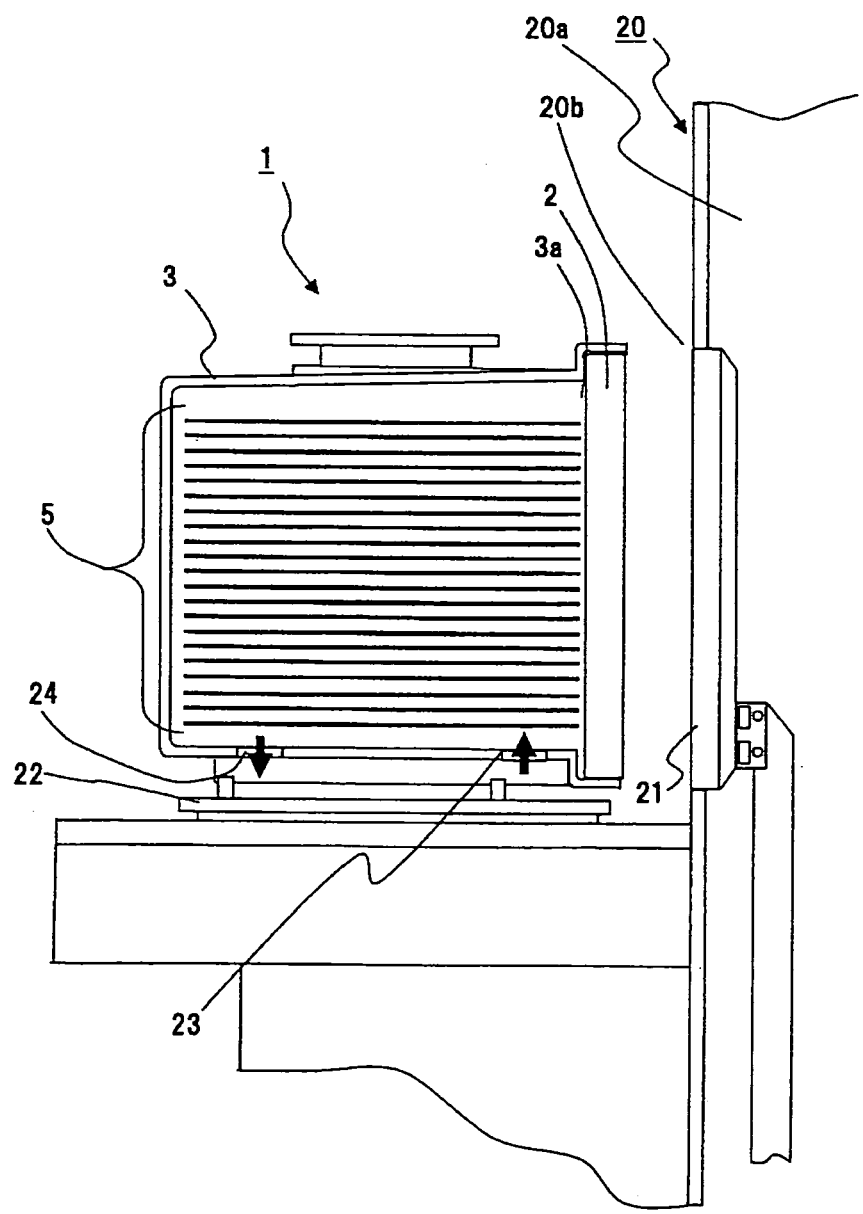
FIG. 5 is a view of a conventional pod under a state in which the pod is placed on a processing apparatus.

Hereinabove, as illustrated in FIG. 1, description is made of an example in which the holes 10 provided by drilling of the lid member 2 are used as the air-supply portion for sending out the replacement gas into the hollow inner space 3b of the pod case 3 of the pod 1. However, it is not necessary to arrange the air-supply portion to the lid member. For example, as in conventional cases, an air-supply port 23 in the lower portion on the opening-3a side of the pod case 3 of the pod 1 may be used as the air-supply portion. FIG. 4 illustrates a case of this example. FIG. 4 illustrates an example in which the exhaust space 15 has the same structure and is arranged at the same position as that of the pod 1 illustrated in FIG. 1, that is, an example in which the air-supply portion is arranged in the lower portion of the pod case 3 as in the conventional cases. Thus, the multiple holes for supplying the replacement gas into the hollow inner space are not arranged in the lid member 2. In this case, it is preferred that selection be made so that a relation is established in which the exhaust space 15 is defined at a position which allows the atmospheric gas to flow from the air-supply portion to the exhaust space 15 along the substrates. Thus, even when the air-supply portion is arranged on the opening-3a side of the pod case 3, as in the above description, it is optimal that the exhaust space 15 be arranged in the lower portion on the inner-end side of the pod case 3, the inner-end side corresponding to the opposite side of the opening 3a in the pod case 3. With this, as indicated by arrows of FIG. 4, the replacement gas can be made to flow from one end side to another end side of each of the substrates-to-be-processed respectively supported by the pairs of the stages of the shelf 5 in the hollow inner space 3b of the pod case 3.

Further, as long as a layout in the hollow inner space 3b permits, it is technically possible to arrange the air-supply portion and the exhaust space 15 in a crosswise direction viewed from the opening 3a of the pod case 3. When a relation is established in which the air-supply portion and the exhaust space 15 are defined at positions which allow the atmospheric gas to flow from the air-supply portion to the exhaust space 15 along the substrates respectively supported by the pairs of the stages of the shelf 5 in the pod 1, an especially excellent effect can be expected in collection of the dust and the oxygen ($O_2$) to be discharged from the exhaust space 15.

(Processing Apparatus)

Next, in the following, with reference to FIGS. 1A to 1D, description is made of how the processing apparatus 20 in which the pod 1 of the present invention is used is different from conventional processing apparatuses.

The processing apparatus 20 includes the air-supply piping fluidically connected to the replacement-gas source filled with the replacement gas. The air-supply piping is arranged so as to be fluidically connectable to the air-supply ports 6 of FIGS. 1A to 1D so that the replacement gas is supplied into the buffer spaces 8 of the lid member 2 of the pod 1 through the air-supply ports 6. Meanwhile, the processing apparatus 20 includes exhaust piping (not shown) which is provided on a load port side corresponding to the lower portion of the pod 1 and which is connected to an exhaust pump (not shown). The exhaust piping is fluidically connectable to the exhaust ports 7a and 7b of the pod 1, and is capable of exhausting the replacement gas from the hollow inner space 3b of the pod 1 through the exhaust ports 7a and 7b. It is effective that the exhaust piping is configured to be somewhat larger in diameter so as to suppress flow-path resistance in the pipeline of the replacement gas.

Note that, the pod 1 according to the invention of the present application is applicable to all the pods of the following types: a type in which a lock mechanism of the lid member is arranged in the lid member 2; a type in which the lock mechanism is arranged on the outside of the lid member 2; and a type in which the lock mechanism is arranged in the lower portion of the pod case 3.

The present invention is applicable to a pod for storing substrates such as semiconductor wafers, specifically, a pod in which especially high cleanliness is required.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-041766, filed Feb. 26, 2010, which is hereby incorporated by reference herein in its entirety.

What is claimed is:

1. A substrate storage pod, comprising:
a pod case including an opening and a hollow inner space for storing a substrate;
a lid member which is to be fit-inserted into the opening to close and seal the opening;
at least two exhaust ports arranged in the pod case so as to exhaust a replacement gas in the hollow inner space; and
an exhaust volume extending in a direction of a width of the opening of the pod case, all sides of the exhaust volume being surrounded by a multi-hole partition member including multiple holes, wherein said exhaust volume fluidically communicates to the at least two exhaust ports,
wherein said exhaust volume fluidically communicates to the hollow inner space only through the multiple holes of the multi-hole partition member to keep a pressure in the exhaust volume lower than a pressure in the hollow inner space, and
wherein said exhaust volume includes a bottom area that includes the at least two exhaust ports and is partitioned on the inner bottom surface of the pod case by the multi-hole partition member, the bottom area being larger than cross sectional areas of flow paths of the exhaust ports in each of flow directions of gas flow being exhausted from the hollow inner space, so that said exhaust volume causes a major flow to invite dust into said exhaust volume from the hollow inner space through the multi-hole partition member.

2. A substrate storage pod according to claim 1, wherein the exhaust comprises therein a meandering flow path for making flow of the replacement gas from the hollow inner space into the at least two exhaust ports.

3. A substrate storage pod according to claim 2, wherein the meandering flow path comprises multiple meandering flow paths formed in gaps between multiple partition plates arranged in combination in the exhaust volume.

4. A substrate storage pod according to claim 1, wherein the exhaust volume extends in a direction angled with respect to flow direction over the substrate toward the exhaust space of the replacement gas from a gas supply portion.

5. A substrate storage pod according to claim 1, further comprising an air-supply portion for supplying the replacement gas into the hollow inner space,
- wherein the exhaust volume is defined at a position which allows the replacement gas to flow from the air-supply portion to the exhaust space along the substrate.

6. A substrate storage pod according to claim 5,
- wherein the lid member comprises a buffer space formed therein for storing the replacement gas,
- wherein an air-supply portion comprises a hole which is provided by drilling of an inner plate of the lid member so as to communicate to the buffer space, and
- wherein the exhaust volume is arranged in a lower portion on an inner-end side of the hollow inner space of the pod case, the inner-end side corresponding to an opposite side of the opening of the pod case.

7. A substrate storage pod according to claim 1,
- wherein the exhaust volume extends along substantially an entire length of a side surface of the pod case.

8. A substrate storage pod according to claim 7,
- wherein the exhaust volume has a length along the side surface substantially the same as a diameter of the substrate.

* * * * *